United States Patent [19]

Katchmar

[11] Patent Number: 5,646,826

[45] Date of Patent: Jul. 8, 1997

[54] PRINTED CIRCUIT BOARD AND HEAT SINK ARRANGEMENT

[75] Inventor: Roman Katchmar, Ottawa, Canada

[73] Assignee: Northern Telecom Limited, Montreal, Canada

[21] Appl. No.: 601,671

[22] Filed: Feb. 15, 1996

Related U.S. Application Data

[63] Continuation-in-part of Ser. No. 579,989, Dec. 28, 1995, abandoned, which is a continuation-in-part of Ser. No. 516,271, Aug. 17, 1995, abandoned, which is a continuation-in-part of Ser. No. 378,336, Jan. 26, 1995, abandoned.

[51] Int. Cl.$^6$ ........................................ H05K 7/20
[52] U.S. Cl. ..................... 361/704; 165/86.3; 165/185; 174/16.3; 174/252; 257/712; 257/718; 361/719; 361/720
[58] Field of Search ................... 165/80.2, 80.3, 165/185; 174/16.3, 252, 259; 257/706, 707, 712, 713, 717–719, 722, 726, 727; 361/688, 704–722, 767, 773

[56] References Cited

U.S. PATENT DOCUMENTS

| | | | |
|---|---|---|---|
| 4,688,077 | 8/1987 | Wakabayashi et al. | 357/81 |
| 4,729,061 | 3/1988 | Brown | 361/386 |
| 4,849,856 | 7/1989 | Funari et al. | 361/386 |
| 4,914,551 | 4/1990 | Anschel et al. | 361/389 |
| 4,924,352 | 5/1990 | Septfons | 361/718 |
| 4,959,900 | 10/1990 | de Givry et al. | 29/840 |
| 5,095,404 | 3/1992 | Chao . | |
| 5,177,669 | 1/1993 | Juskey et al. | 257/675 |
| 5,218,516 | 6/1993 | Collins et al. | 361/386 |
| 5,223,747 | 6/1993 | Tschulena | 257/713 |
| 5,262,922 | 11/1993 | Yamaji et al. | 361/720 |
| 5,294,826 | 3/1994 | Marcantonio et al. . | |
| 5,467,251 | 11/1995 | Katchmar | 361/719 |

FOREIGN PATENT DOCUMENTS

| | | |
|---|---|---|
| 0130279 | 1/1985 | European Pat. Off. . |
| 0232098 | 8/1987 | European Pat. Off. . |
| 4106185A1 | 9/1992 | Germany . |

OTHER PUBLICATIONS

IBM Technical Disclosure Bulletin, vol. 19, No. 11, Apr. 1977, pp. 4165–4166, "Heat Dissipation from IC Chips Through Module Package", D. Balderes et al.

*Primary Examiner*—Gregory D. Thompson
*Attorney, Agent, or Firm*—R. J. Austin

[57] ABSTRACT

Making a heat sink and printed circuit board assembly by providing a heat exchange element on the heat sink which lies in heat exchange contact with the heat sink and passes therethrough. After locating the board and heat sink in relative positions apart and with the heat exchange element aligned with an electronic component on the board, a settable thermally conductive compound is injected through a hole in the heat exchange element to bond it to the electrical component. The heat sink is detachable from the heat exchange element to expose the side of the board carrying the components so that maintenance or repair may be performed. Subsequently the heat sink is returned into its position in the assembly.

25 Claims, 8 Drawing Sheets

PRINTED CIRCUIT BOARD AND HEAT SINK ARRANGEMENT

This is a continuation-in-part application of application Ser. No. 08/579,989 filed Dec. 28, 1995 now abandoned which is a continuation-in-part of application Ser. No. 08/516,271, filed Aug. 17, 1995 now abandoned which is a continuation-in-part of application Ser. No. 08/378,336, filed on Jan. 26, 1995, in the name of Roman Katchmar and entitled, "Printed Circuit Board and Heat Sink Arrangement" now abandoned.

This invention relates to printed circuit board and heat sink arrangements.

In structures of printed circuit boards carrying electronic components, heat is generated by the components in use and it is necessary to remove this heat so as to prevent overheating which could result in breakdown of one or more of the components. To remove the heat, heat sinks are conventionally used. For efficient heat exchange to occur, it has sometimes been deemed necessary for heat sink to be intimately attached directly to a printed circuit board. However, this raises a problem in that it may be required to dismantle a printed circuit board and heat sink assembly for inspection, modification, or repair purposes and separation of the board from the heat sink may be virtually impossible without attendant destruction to one or more parts of the assembly.

In other suggested structures, heat sinks are located on the same side of a printed circuit board as the electronic components so that the components lie between the board and the heat sink. Heat is transferred to the heat sink by a heat transfer medium compound from the electronic components. Again, there is the problem of disassembly of the parts should this be required for any reason. Further, if the compound is applied into position before assembly of the parts. This may not result in a satisfactory thermal connection between adjacent surfaces for promoting heat conduction. This latter method of assembly also is laborious and time consuming. Examples of this type of structure are to be found in U.S. Pat. Nos. 4,849,856 and 4,914,551.

In U.S. application Ser. No. 08/133,396 filed Oct. 9, 1993 in the name of R. Katchmar, there is described a structure in which heat is dissipated throughout a printed circuit board from electronic components mounted upon the board, the heat then being removed by bridging members extending to a heat sink from the board. In this arrangement, electronic components are bonded to the printed circuit board by a thermally conductive compund which has been caused to flow into spaces between the component and the heat sink, the thermal compound then setting in position.

The present invention seeks to provide a method of forming a printed circuit board and heat sink assembly which minimizes the above problems.

The present invention provides a method of making a printed circuit board and heat sink structure assembly comprising: providing a structure comprising a printed circuit board and an electronic component mounted upon a first side of the printed circuit board; providing a heat sink structure with a hole defined through the heat sink structure; relatively disposing the printed circuit board structure and the heat sink structure with a first side of the heat sink structure facing and spaced from the printed circuit board structure and with the hole having its axis extending in a direction generally towards the electronic component; and creating a heat conductive path from the heat sink structure to the printed circuit board structure by causing a flowable thermally conductive material or compound to flow through the hole so as to occupy and remain in a spatial region between and in heat conductive contact with the heat sink structure and the printed circuit board structure and in alignment with the electronic component.

Various thermally conductive materials or compounds which are suitable are known in the art of thermal management of electronics device power. As an example a suitable material is an admixture of a silicone based resin and thermally conductive particles (e.g. boron nitride particles). The percentage of the particles in the admixture influences the thermal conductive properties of the admixture. Such an admixture may be caused to flow to achieve the method of the invention for a specific time period after formulation of the resin and may, dependent upon the specific resin mix, be curable into a set condition either at room temperature or at an elevated temperature insufficiently high to damage components, e.g. in the region of 60° C. to 80° C. or even higher. A suitable viscosity modifier may be required to curtail slump characteristics of the uncured compound. An alternative suitable material employs an epoxy based resin in admixture with thermally conductive particles e.g. boron nitride. Optimum thermal performance can be attained with certain metal alloys with sufficiently low melting joints, such as indium/tin alloys which may have melting points at 118° C. or lower. However, when using metal alloys which have electrically conductive properties, control of the dispensing process is critical to ensure that none of the alloy material flows beyond its required position to provide the desired heat conductive function in order to ensure that the alloy material does not cause shorting of electrical or electronic components.

With the use of the method of the invention, the printed circuit board and heat sink structures are assembled together into their relative positions before the thermally conductive compound is cast in position. Because the thermally conductive material or compound is caused to flow between the two structures subsequent to their assembly together, then the flowing material intimately contacts the surfaces of the two structures between which heat is to be conducted thereby maximizing the thermal conductive efficiency of the assembly. In addition, it is convenient to manufacture the assembly by the above method because the thermal conductive material is not positioned upon one of the structures before the other structure is located in position and thus any slow and messy assembly steps are avoided. In contrast, because the flowable material is caused to flow through a hole in the heat sink structure, then the method is particularly suitable for use with injection apparatus, i.e. by location of an injection nozzle into the hole for injection of the material between the two structures. Hence, the process step of locating the thermally conductive material in its correct position is easily, quickly, efficiently and cleanly accomplished. The resultant assembly of the printed circuit board and heat sink structures is known to optimize heat removal from components mounted upon a printed circuit board and is thus particularly relevant to removal of heat from printed circuit board structures in which the heat generated could result in electronic component failure for malfunction if not conducted away with suitable efficiency.

In a method according to the invention, the process steps may be followed with the heat sink structure facing either the first side or a second side of the printed circuit board structure. With the heat sink structure facing the first side of the printed circuit board, the thermally conductive material is caused to flow through the hole to fill a spatial region between the heat sink structure and the electronic component itself. Thus, the thermally conductive material is in direct heat conductive contact with the electronic component which lies closest to the heat sink structure. Alternatively, with the heat sink structure facing the second side of the printed circuit board then the thermally conductive material in flowing through the hole occupies a spatial region between the heat sink structure and the printed circuit board itself. For maximizing heat conduction from the electronic component, there must be some heat conductive path from the thermally conductive material in the spatial region through the board and towards the electronic component. This is conveniently provided by causing the thermally conductive material to flow from the spatial region through at least one aperture in the printed circuit board and towards and preferably into heat conductive contact with the electronic component. In a practical method, a first mass of the thermally conductive material is caused to flow between the first side of the printed circuit board and the electronic component and a second mass of the material is then caused to flow between the side second side of the printed circuit board and the heat sink structure. This may be conveniently performed by inserting an injection means through the hole in the heat sink structure and into the aperture in the printed circuit board and injecting the first mass between the first side of the board and the component and subsequently withdrawing the injection means from within the aperture so that it is inserted only into the hole of the heat sink structure whereby the second mass may be caused to flow between the second side of the board and the heat sink structure. In an alternative method, the first mass is caused to flow between the first side of the board and the electronic component while the two structures are separate from one another and then after the structures are assembled together the second mass is caused to flow through the hole to occupy the space between the board and the heat sink structure.

The method of the invention may advantageously be used while enabling the heat sink itself to be removed from the printed circuit board structure thereby rendering the board or the electronic component immediately accessible for maintenance, replacement or for inspection purposes. This may be accomplished when the heat sink structure comprises a heat sink and a heat exchange element thermally conductively mounted upon the heat sink. The heat exchange element is spaced from and opposes the printed circuit board structure while facing towards the electronic component and the settable thermally conductive material is disposed between and in thermally conductive contact with the printed circuit board structure and the heat exchange element. In this preferred method, the thermally conductive material has an adhesive property which provides adherence between the printed circuit board structure and the heat exchange element, and heat sink release means is provided which enables the heat sink to be removed from the heat exchange element which remains carried upon the printed circuit board structure by the adhesive nature of the thermally conductive material. The heat release means conveniently comprises a heat exchange pedestal in screw-threaded arrangement. This screw-threaded arrangement comprises a screw thread on the heat exchange element and a nut engageable on the end region on a side of the heat sink remote from the printed circuit board. Removal of the nut thereby enables heat sink to be detached from the assembly of the printed circuit board structure and the heat exchange element carried thereon by the thermally conductive material. Hence, the electronic component is immediately accessible as related above. Alternatively, when not employing a nut, the screw-threaded means allows for rotation of the heat exchange element within the heat sink. With this function, either the heat exchange element has a frangible region or the thermally conductive material is itself frangible. Hence, upon rotation of a part of the heat exchange element within the aperture, either the frangible region of the heat exchange element or the frangible thermally conductive material fails thereby enabling for detachment of the heat sink from the printed circuit board.

The invention is particularly useful in cases in which, as is normal, a plurality of electronic components are disposed between the printed circuit board and the heat sink. One problem is normally caused because printed circuit boards are not absolutely planar and together with the fact that electronic components are of different shapes and heights, there is the problem of connecting each of the components to the heat sink directly in a thermally conductive manner with thermally conductive material and while minimizing stresses upon the printed circuit board, electrical components or termination leads from the components. This problem becomes aggravated during temperature fluctuations caused by in-use equipment environment. The present method when placing the electronic components between the board and the heat sink minimizes these problems in that while the spaces between the heat sink and the electronic components may be different from component-to-component, the thermally conductive material injected through individual holes associated with each component, will fill each spatial region as necessary to form a thermally conductive shunt from that component to the heat sink.

In addition, while the component is mounted on the first side of the board and is remote from the heat sink, where the thermally conductive compound actually flows completely through the board and into contact with the electronic components this arrangement minimizes heat stresses upon the board and also minimizes the amount of stress experienced by solder joints at the terminals of the electronic components onto the board while providing a path of low thermal resistance into the heat sink. With this arrangement also, the sensitivity of the structure to breakage due to board warpage and distance variations is minimized. In particular, the arrangement with the electronic component on the side of the board remote from the heat sink is particularly useful for heat removal from electronic components which use solder ball arrays for terminal connection to printed circuit boards.

According to a further aspect of the present invention there is provided a printed circuit board and heat sink structure assembly comprising: a structure of a printed circuit board and an electronic component mounted upon a first side of the printed circuit board; a heat sink structure with a hole defined through the heat sink structure; the two structures disposed face-to-face and spaced apart with the hole extending in a direction generally towards the electronic component; and a thermally conductive material that has flowed through the hole to be disposed between the two structures and occupy a spatial region extending across the hole and in thermal conductive contact with both structures and in alignment with the electronic component.

Embodiments of the invention will now be described, by way of example, with reference to the accompanying drawing, in which.

Figure 1:
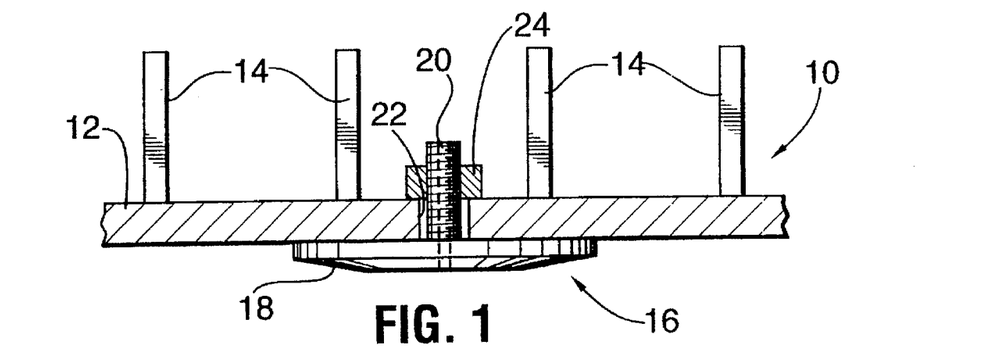
FIGS. 1, 2 and 3 are cross-sectional views showing three different stages in the manufacture of an assembly of printed circuit board and heat sink structure according to a first embodiment.

In the first embodiment, as shown in FIG. 1, a heat sink structure comprises a heat sink 10 with a flat planar member 12 with fins 14 integrally formed from one side of the member 12. The heat sink structure also comprises a plurality of heat exchange elements 16 (one being shown) each comprising a wide portion 18 integrally formed with a narrow portion in the form of a cylindrical spindle 20 screw-threaded at an outer free end. Each of the elements 16 is assembled to the heat sink by passage through an individual clearance hole 22 in the heat sink and the location of a connecting means in the form of a nut 24 on the fin side of the planar member 12, the nut 24 screw-threadably received upon the screw-thread of the shaft 20. The wide portion is thus held in tight thermal-conducting contact with the heat sink. If required, a film of thermally conductive grease may be disposed between the wide portion 18 and the heat sink through a dry contact is normally sufficient.

Figure 2:
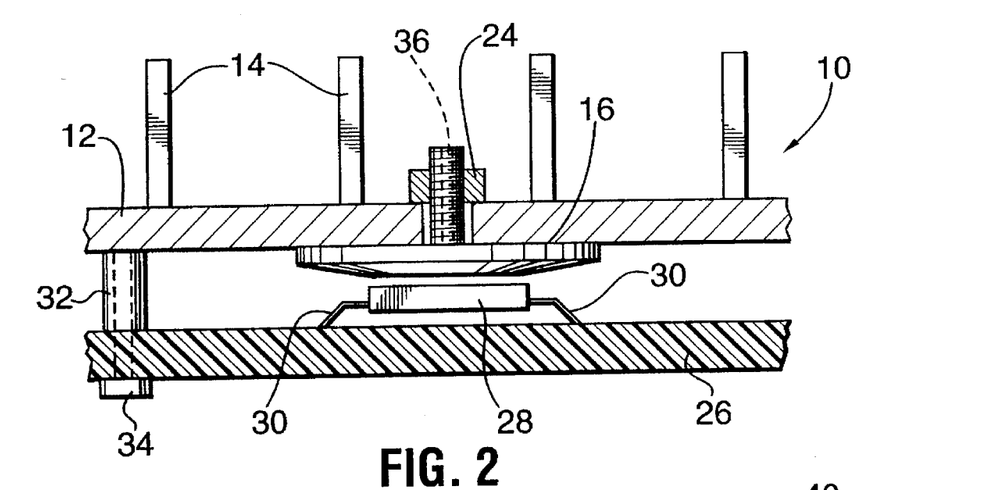

In the first embodiment a printed circuit board 26 is also provided (FIG. 2). The printed circuit board has mounted on one side a plurality of electronic components 28 which are connected by termination leads 30 to circuitry on the board.

It is intended to assemble the printed circuit board structure including the components 28 onto the heat sink with the heat taken directly from the components 28 through the heat exchange elements and into the heat sink. For this purpose the board and the heat sink are disposed in relative positions as shown in FIG. 2 in which the heat sink 6 is located a spaced distance away from the printed circuit board while lying in face-to-face opposition to it by spacers 32 which are secured to the printed circuit board by securing bolts 34. The heat exchange elements 16 are prior positioned upon the heat sink 10 so that when assembled to the printed circuit board each of the elements 16 is located with its wide portion 18 spaced from and directly opposing a corresponding individual electronic component 28. This is clearly as shown in FIG. 2.

Figure 3:
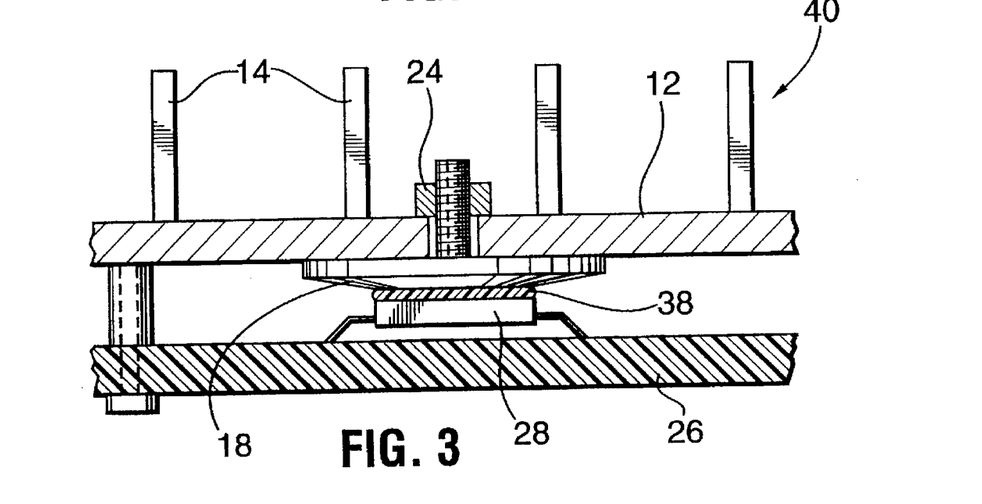

To complete the assembly, a settable thermally conductive viscous material which may have adhesive properties is disposed within the spatial region between each electronic component 28 and the wide portion 18 of its corresponding heat exchange element 16. This material may be a thermally conductive elastomeric viscous material with a low modulus of elasticity preferably below 5000 psi. The thermally conductive elastomeric viscous material in this and other embodiments is an admixture of a silicone based resin and boron nitride particles. The quantity of the particles, in percentage by weight in the total admixture, controls the thermally conductive properties of the admixture which may thus be as desired. For the purpose of disposing the thermally conductive medium within each space, the elements 16 are provided with holes 36 extending through the elements from side-to-side i.e. coaxially along the shaft 20 and through the wide portion 18 as indicated in FIG. 2. With the heat sink and printed circuit board assembly at the stage as shown in FIG. 2, the thermally conductive material is injected at room temperature through each of the holes from the outside of the heat sink so as to occupy and fill the spatial regions between the wide portions and the electronic components 28 as shown at 38 in FIG. 3 while possibly also intimately engaging the surfaces at each side of the space to provide an efficient heat exchange medium from the components 28 into the elements 16. The thermally conductive material is then cured at around 60° C. to 80° C. and after setting then effectively secures the wide portions 18 of the elements 16 to the electronic elements 28 as shown by FIG. 3. By injecting the material 38 into the spatial regions after assembly of the printed circuit board and heat sink structures, the material flows progressively across the opposing surfaces to provide intimate engagement with those surfaces thereby ensuring maximized heat conduction from each component to the heat sink. Also, the injection process is clean, efficient and time saving.

Figure 4:
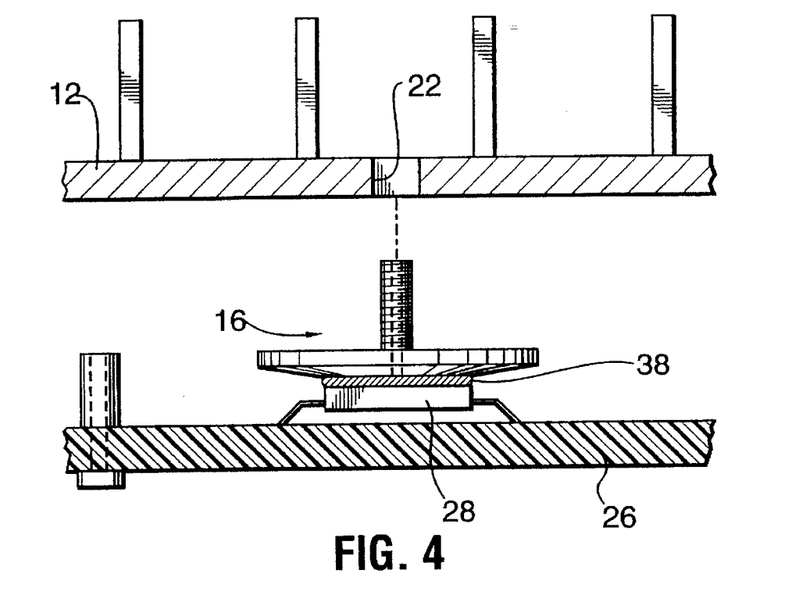
FIG. 4 is a view similar to FIGS. 1 to 3 of the assembly of the first embodiment and showing removal of the heat sink from the assembly to render the printed circuit board and electronic components accessible.

In use of the finished assembly 40 in FIG. 3, any heat generated by the electronic components is transferred directly with maximum efficiency through the thermally conductive adhesive 38 into the wide portions 18 of the elements 16 and into the heat sink 10 by the thermally conductive contact of the wide portions with the inside surface of the heat sink. When it is required to obtain access to the side of the printed circuit board having the electronic components mounted thereon, it is a simple matter to release the heat sink from the printed circuit board structure merely by removing the nuts 24 so as to allow the heat sink to be pulled away from the board thereby exposing the components 28 and the circuitry of the board for any required purpose. This particular stage is indicated by FIG. 4 in which it can be seen that each of the elements 16 remains attached to its respective electronic component 28 by the thermally conductive material 38 lying between them. In essence therefore, while the structure originally was built from two subassemblies, in which one of the subassemblies consisted of the heat sink with the heat exchange elements 16 attached, after the complete assembly 40 has been built, then it is necessary to disassemble the heat exchange assembly by disconnecting the heat sink from each of the elements 16. After the appropriate action has been taken upon the printed circuit board or upon any electronic element, it is a simple matter to add the heat sink once more to complete the assembly by simply aligning the clearance holes 22 with the corresponding shafts 20 and moving the heat sink back into its assembled position as shown in FIG. 3, the securing nuts 24 then being added.

As may be seen from the above embodiment, a printed circuit board and heat sink assembly is provided in which the thermally conductive material in flowable condition is easily, quickly and cleanly added by an injection procedure. Also, disassembly of the heat sink to render the printed circuit board or the electronic components accessible is an exceedingly simple matter and may be quickly accomplished without any damage occurring to any of the parts of the assembly. It is also a simple matter to replace the printed circuit board subsequently so as to reform the assembly. In addition to this, although complete thermal conductive contact is created between each of the electronic components 28 and the heat sink 10 by way of the thermally conductive material 38, minimal stresses are built into the assembly although differences in distance exist between the electronic components and the heat sink. For example, stresses created by temperature expansion differences between the heat sink and printed circuit board. As may be seen, the distances between the elements 16 and the components 28 may vary widely, but such variation is unimportant because any spatial region that is created between elements 16 and the corresponding components 28 is easily filled with material 38 while ensuring that thermal conductive contact is ensured. Minimal stresses are built into the assembly therefore between the heat sink and the printed circuit board which could create problems after the assembly has been built.

Lateral stresses (which could be induced by temperature variations) are minimized by employing a heat sink comprised of a material which has a temperature coefficient of expansion reasonably matched to the printed circuit board, preferably within $\pm 3\times 10^{-6}/°C$. For example, alloys of copper, or composites or alloys of aluminum and silicon are inexpensive, yet work well.

In further embodiments and modifications, now to follow, parts similar to those in the first embodiment bear like reference numerals.

Figure 5:
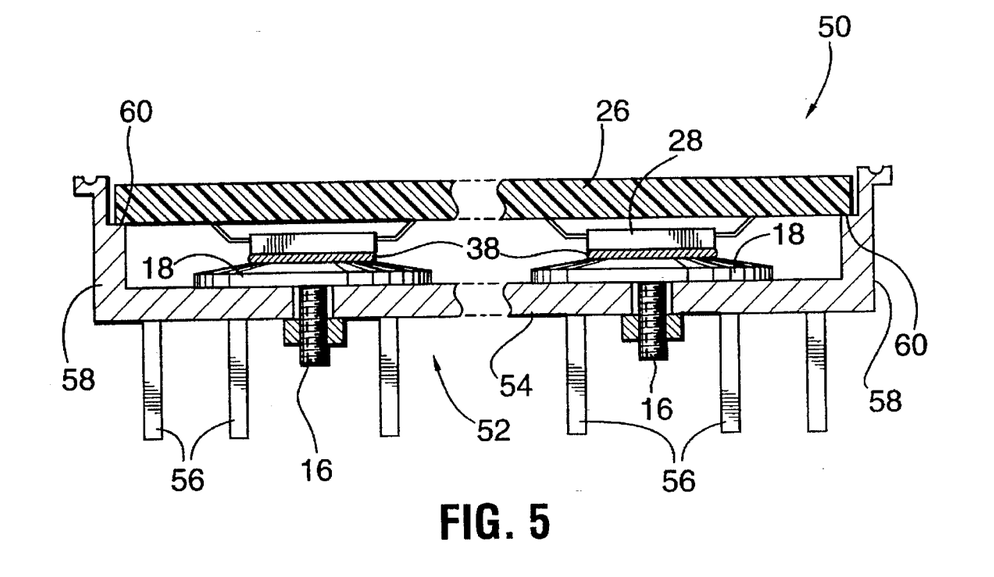
FIG. 5 is a view similar to FIG. 3 of an assembly of printed circuit board and heat exchange structures according to a second embodiment.

In a second embodiment as shown in FIG. 5, a printed circuit board 26 is formed into a printed circuit board structure with a plurality of the electronic components 28 as described in the first embodiment. A heat sink 52 has a planar member 54 similar to that of the first embodiment and also has integrally formed spaced parallel fins 56 extending from one side of it. In addition, this heat sink is also provided with elements 16 as in the first embodiment, these elements being positioned so that in the complete assembly 50 the wide portions 18 of the elements are spaced from and oppose the electronic components 28. Thermally conductive material 38 is disposed between the electronic components and the elements 16 in the manner described in the first embodiment. The assembly 50 differs from the assembly of the first embodiment in that the heat sink 52 has side walls 58 extending from the four marginal edges of the planar member 54 and outwardly from one side of the plane of the member 54. These side walls have a planar engagement surface 60 facing outwardly and this surface engages an edge region of the printed circuit board 26 so as to hold the printed circuit board a fixed distance away from the planar member 54 of the heat sink preparatory to the material 38 being injected between the components 28 and the elements 16.

Figure 6:
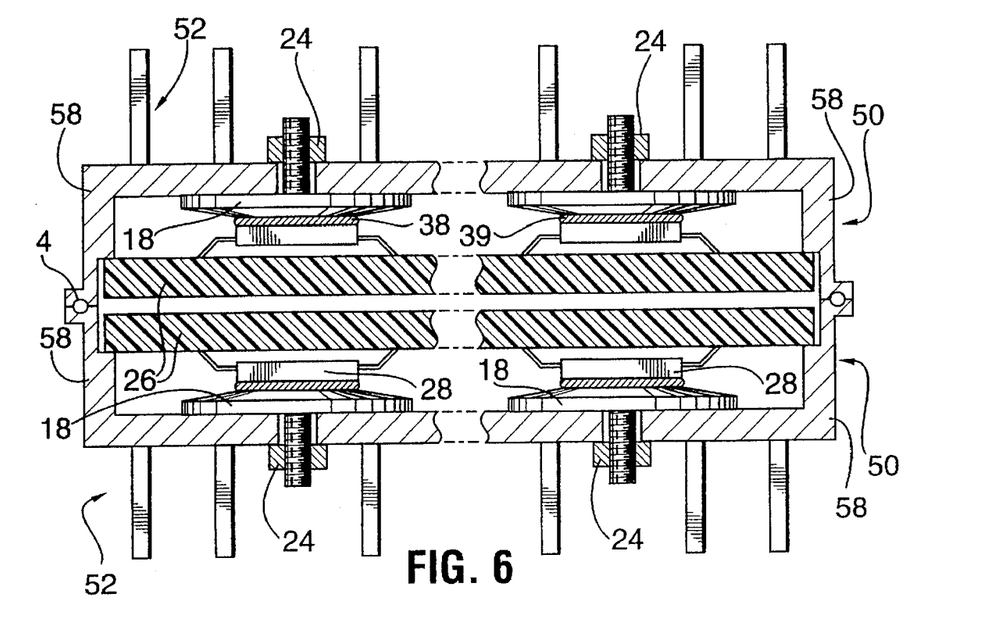
FIG. 6 is a view similar to FIG. 5 and showing two assemblies according to the second embodiment mounted together to form an overall assembly with a housing.

The assembly 50 is particularly useful when combined with a similarly built assembly 50 as shown in FIG. 6 when the two assemblies are disposed together in mutually reversed positions so that the walls 58 cooperate from one assembly to the other to form a housing for containing printed circuit board structures. As shown in FIG. 6, the two side walls 58 are provided with means for assembling the side walls together, this means in this instance being in the form of outwardly projecting flanges 62 which abut together for assembly purposes and may be held in position either by brackets (not shown) or by screw-threaded structures to hold against an elongate seal 64. As may be seen from FIG. 6, with each assembly 50 having a printed circuit board mounted thereon, the printed circuit boards in the finished assembly are spaced apart from each other and the electronic components 28 are secured to the elements 16 by the thermally conductive material 38.

Figure 7:
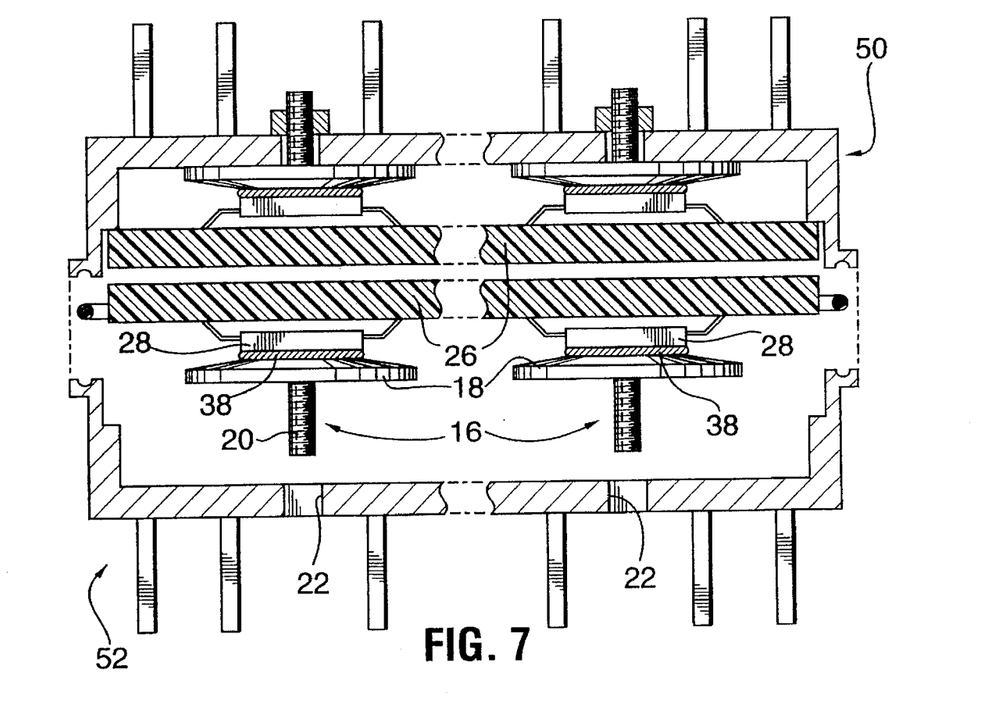
FIG. 7 is a view similar to FIG. 6 and showing the structure of FIG. 6 with one heat sink removed.

As shown by FIG. 7 if it is required to remove either of the heat sinks 52, the associated nuts 24 are removed from the elements 16 so that the heat sink may be withdrawn. In this condition, and as shown by FIG. 7 the corresponding printed circuit board 26 with its electronic components 28 mounted thereon is exposed for any required purpose. In this particular instance, the printed circuit board remains substantially in its "in-use" position and is held there by any electrical conductors extending to it. To assemble the heat sink which has been removed, it is simply necessary to align the clearance holes 22 with the shafts 20 and move the board onto the shafts to assemble it to the board 12. The assembly then is completed with the addition of the nuts 24 followed by realignment of the two heat sinks 52 to enable them to be reassembled to form the housing.

Figure 8:
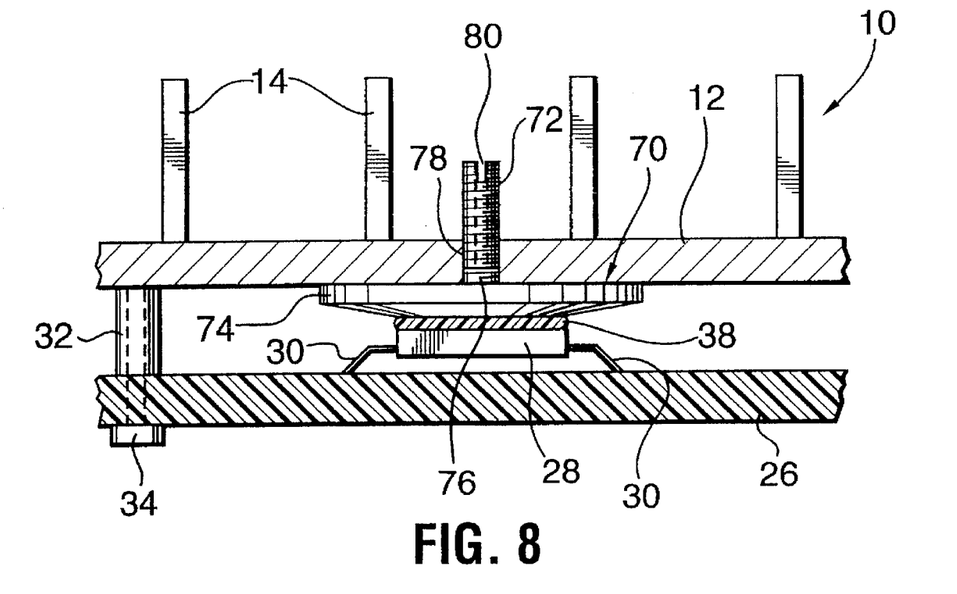
FIGS. 8 and 9 are views similar to FIGS. 3 and 4 of a modification to the first embodiment.
Figure 9:
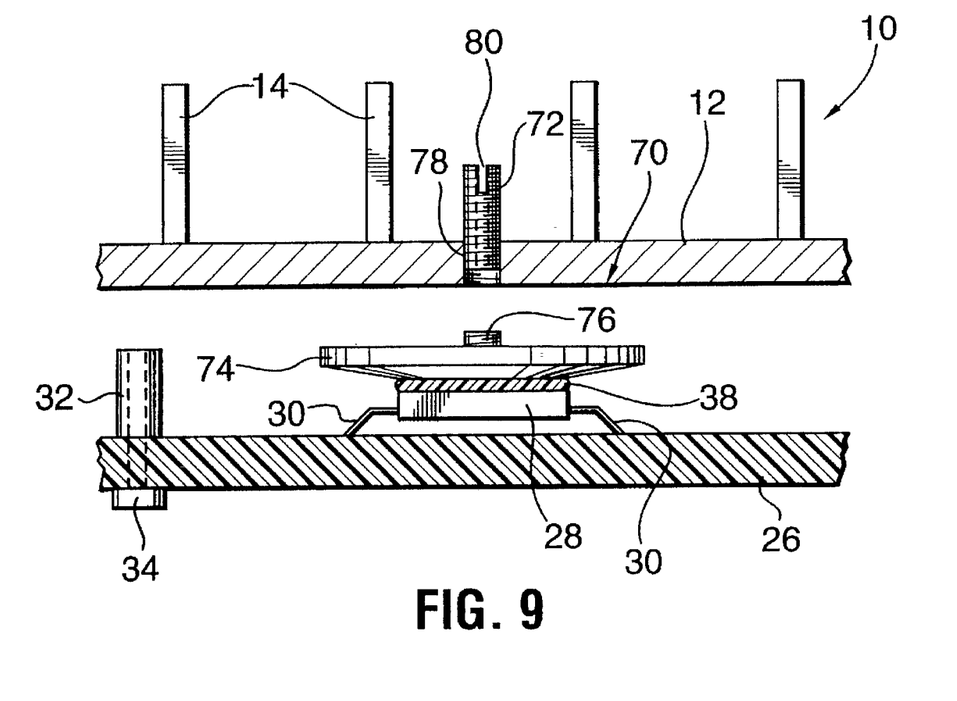

It is not necessary for the separation of the heat sink from the printed circuit board to be performed in the manner described in the above embodiments. For instance, in a first modification of the first embodiment shown in FIGS. 8 and 9, a heat exchange element 70 is similar to the heat exchange element 16 described above except that at the junction of the narrow portion 72 with the wide portion 74 of the element a narrowing neck 76 of the narrow portion is provided to render it frangible. FIG. 8 shows the complete assembly of the modification and differs from the above embodiments in that the narrow portion 72 is screw-threadably received within a screw-threaded hole 78 in the planar member 12 of the heat sink. To enable removal of the heat sink 10, a screw driver is inserted into an end slot 80 in the narrow portion 72 of the heat exchange element and the narrow portion is rotated within the screw-threaded hole. Immediately upon rotation the neck 76 fractures as the wide portion 74 of the element is retained in position by the adhesive 38 thereby separating the narrow portion 72 as shown in FIG. 9 and enabling removal of the heat sink. Clearly, with this type of an arrangement, stripping down of the assembly of printed circuit board, electronic component 28 and the wide portion of the heat exchange element would be necessary so as to enable reassembly and the use of replacement heat exchange elements 70 in combination with the heat sink 10 when this is once again placed into position.

Figure 10:
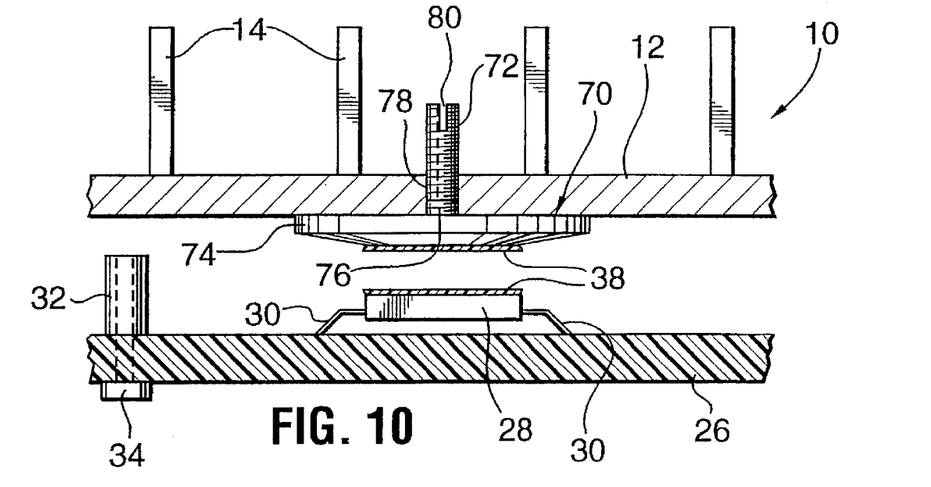
FIG. 10 is a view similar to FIG. 4 of another modification to the first embodiment.

In a further modification of the first embodiment as shown in FIG. 10, it is possible that the set thermally conductive material 38 itself is frangible so that upon insertion of a screw driver into the end slot 80 of the heat exchange element 70, the thermal compound 38 fractures to enable the heat sink 12 to be removed together with the whole of the heat exchange element.

It is within the scope of the invention for instance, as shown in embodiments now to be described, for an electronic component or components to be located on the side of the printed circuit board remote from the heat sink.

Figure 11:
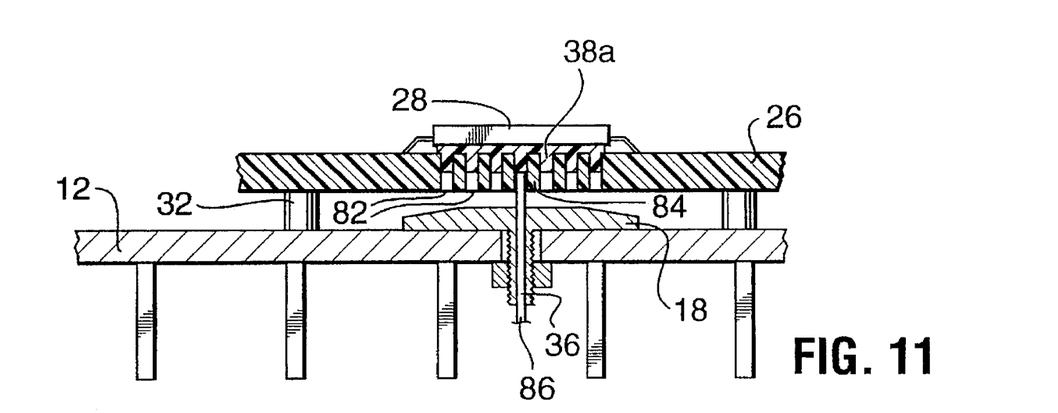
FIGS. 11 and 12 show two different stages in the manufacture of an assembly of printed circuit board and heat sink structures according to a third embodiment.
Figure 12:
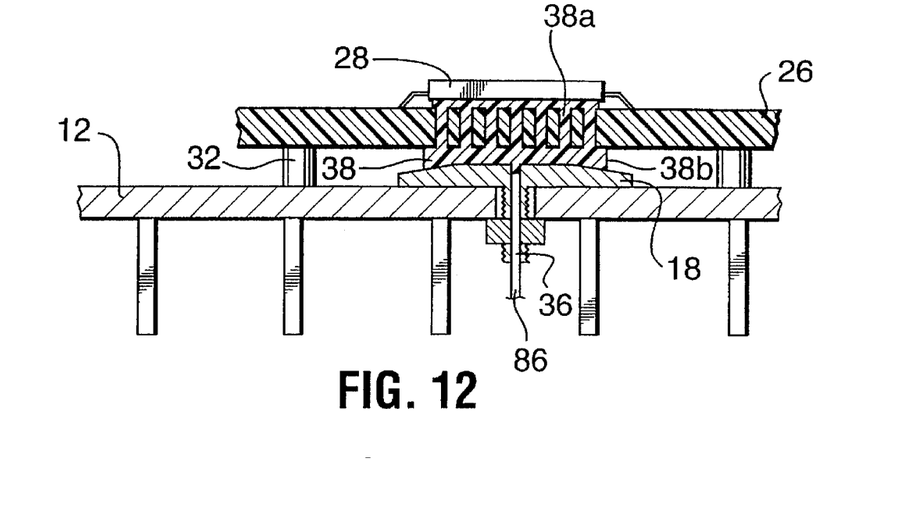
Figure 13:
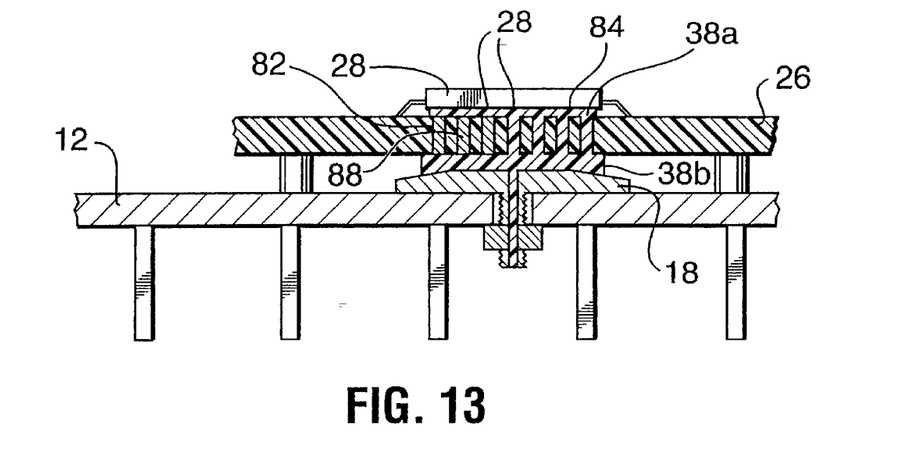
FIG. 13 shows the completed assembly of the third embodiment.

For instance, as shown in a third embodiment in FIGS. 11, 12 and 13, the heat sink 10 has one or more heat exchange elements mounted upon it in the manner described in the first embodiment. In the third embodiment only one such element is shown. However, the printed circuit board structure is reversed in position so that the electronic components 28 are separated from the heat sink by the printed circuit board 26.

FIG. 11 shows the state of the structure with the heat sink spaced apart from the printed circuit board at a first stage in the application of the settable thermally conductive material 38. As may be seen from FIG. 11, a plurality of apertures 82 are provided through the printed circuit board to a position beneath each electronic component 28. A substantially centrally located aperture 84 is approximately in alignment with the hole 36 through each associated heat exchange element 16. A thermally conductive material 38 is applied in two separate masses 38a and 38b (see FIG. 12). The first mass 38a in each case, is applied by inserting an injection means in the form of an injection nozzle 86 through a hole 36, the nozzle being sufficiently long to extend into the corresponding aperture 84 as shown by FIG. 11. The mass 38a is then injected in the spatial region between the printed circuit board 26 and the electronic component 28. This mass moves progressively beneath the component 28 and intimately engages the surface of the component and the surface of the printed circuit board. As shown by FIG. 12, the nozzle 86 is then retracted to a position in which its outlet end lies in the aperture 36. The second mass 38b of the thermally conductive material 38 is then injected into the spatial region between the printed circuit board and the wide portion 18 of the heat exchange element 6 so as to intimately engage the opposite surface of the printed circuit board and the end surface of the wide portion 18. During this procedure, the aperture 84 should be substantially filled with the material 38. Further, as shown on the right-hand side of the aperture 84 in FIG. 13 which shows the finished construction of the assembly, the apertures 82 should be at least partly filled with compound 38 from each side of the board and preferably the compound should continue through each of the apertures 82 to interconnect the two masses 38a and 38b. Alternatively, as shown on the left-hand side of FIG. 13, the apertures 82 may have been pre-filled by solder 88 or by some other thermally conductive material such as copper to assist in transferring the heat from the mass 38a to the mass 38b and then through the heat exchange element 6 into the heat sink.

Figure 14:
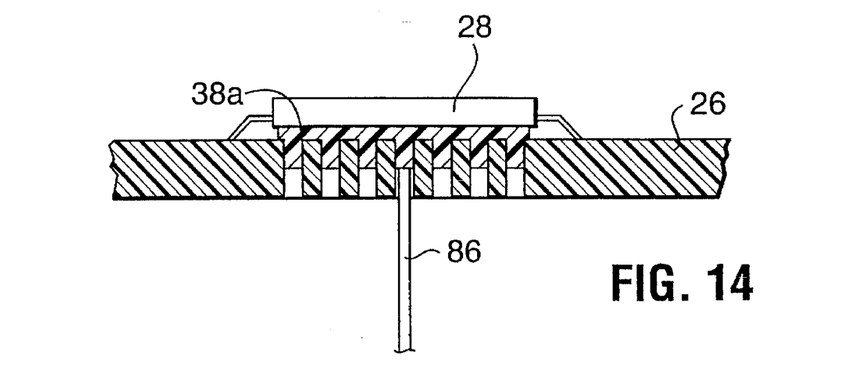
FIG. 14 relates to an alternate method to that shown in FIGS. 11 and 12 and shows a first of two different stages in the manufacture of the assembly of the third embodiment.

In an alternative method of producing the structure of FIG. 13, and as shown by FIG. 14, each mass 38a is located between its associated electronic component 28 and the printed circuit board 26 before the printed circuit board structure is assembled onto the heat sink structure. With this method, the injection nozzle 86 is passed into the aperture 84 and the mass 38 is injected into the spatial region beneath the component 28. When all of the masses 38a are in position the printed circuit board structure with the masses 38a is completed and is assembled onto the printed circuit board structure. The mass 38b is then formed between the printed circuit board and the heat sink 12 in the manner described above with reference to FIG. 12. The completed construction is again as shown by FIG. 13.

Figure 15:
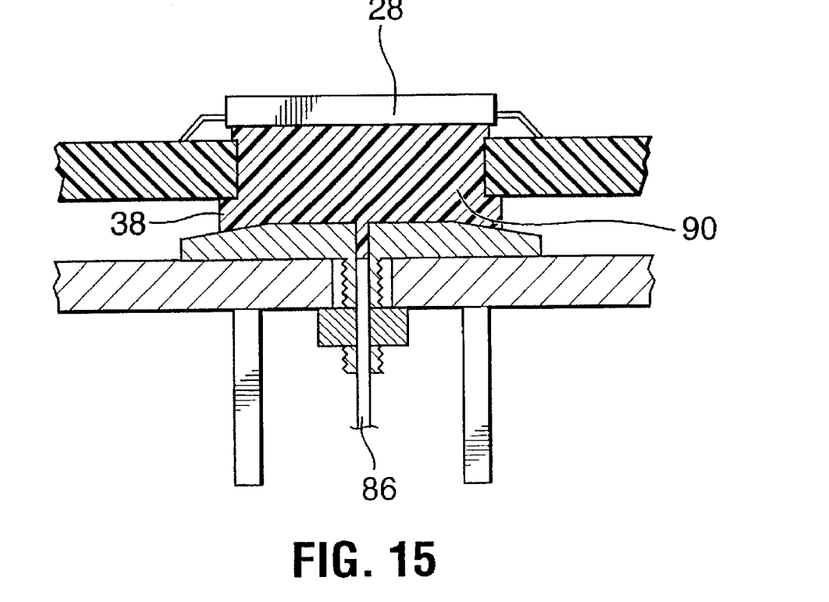
FIG. 15 is a view similar to FIG. 13 of a fourth embodiment.

In a fourth embodiment as shown in FIG. 15, beneath each component 28 mounted on the printed circuit board 26 there is a substantially large aperture 90 provided. This aperture may be elongate or of other shape so as to extend substantially beneath the shape of the associated component 28. With the heat sink structure and the printed circuit board structure assembled together, the nozzle 86 is inserted into each hole 36 and by a single injection operation, a single complete mass of the thermally conductive material 38 is injected into a spatial region extending between the end surface of the wide portion 18 of the heat exchange element to the opposing surface of the associated electronic component 28, the mass 38 passing through the aperture 90 to achieve direct thermal conductive contact from the component to the wide portion 18 of the heat exchange element.

In all of the above embodiments in which the electronic component lies on the side of the printed circuit board remote from the heat sink, then it is found in practice that there is a minimized possibility of the printed circuit board bending due to variations in temperature or localized heat effects. In addition, there is minimal stress applied to the solder joints of the components at the terminations of the printed circuit board.

Figure 16:
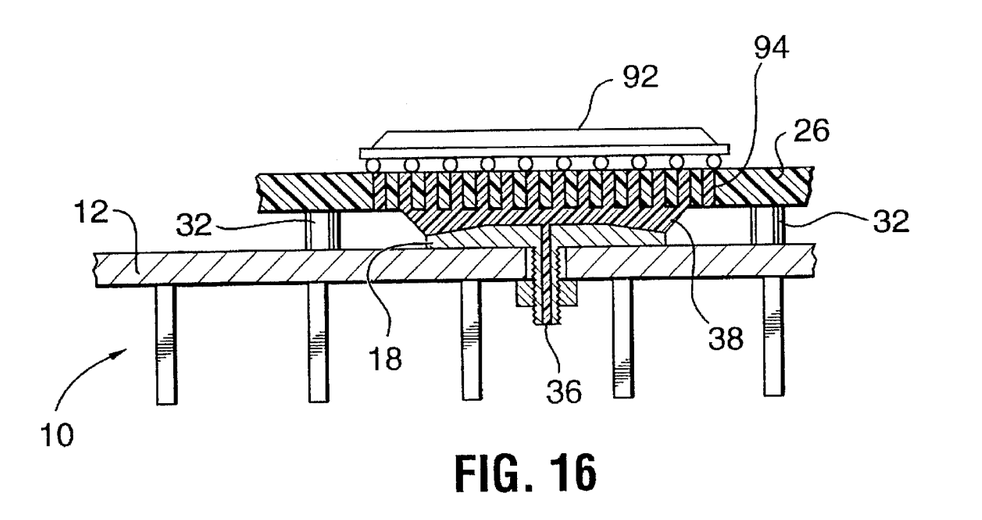
FIG. 16 is a cross-sectional view of an assembly according to a fifth embodiment.
Figure 17:
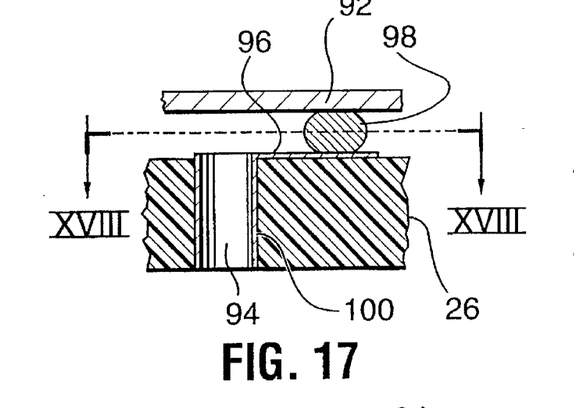
FIG. 17 is a cross-sectional view of part of the assembly according to a fifth embodiment and to a larger scale.
Figure 18:
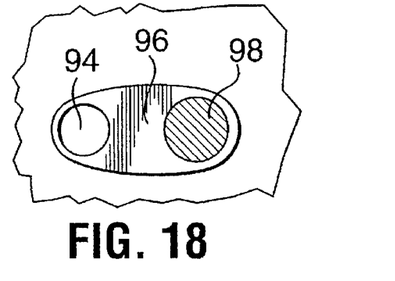
FIG. 18 is a cross-sectional view of the part of the assembly taken along line XVIII—XVIII in FIG. 17.

With the electronic components disposed on the opposite side of the printed circuit board from the heat sink, this particular arrangement is applicable with advantages for extracting heat from electronic components, e.g. of planar configuration and with terminal connections to the printed circuit board by means of ball grid arrays. For instance, as shown in the fifth embodiment in FIG. 16, a planar electronic component 92 is disposed on the side of the printed circuit board 26 remote from the heat sink 10 with spacers 32 located in place as described in the above embodiments. For each of the components 92, a heat exchange element is again employed and is disposed with its wide portion 18 facing in a direction towards its corresponding electronic component 92 and with the printed circuit board 26 positioned in between. As illustrated in FIG. 16, the thermally conductive material 38 occupies the spatial region between the board and the wide portion of each of the heat exchange elements and also passes into apertures 94 in the printed circuit board. As shown by FIGS. 17 and 18, the apertures 94 are in the form of vias and have conductive footprints 96 on the remote side of the board. The footprints 96 are connected to the terminals of the electronic components by solder balls 98 applied in known manner for forming the terminal connections. The apertures 94 are provided with linings 100 of conductive material, e.g. copper for connecting each of the terminals of the electronic components to circuitry within the board. The viscous thermally conductive material 38 extends into each of the apertures 94 so as to be in direct heat conductive contact with the linings 100 for removal of heat from the electronic components. The Thermally conductive material may also be permitted to flow in the space defined by 92, 96.

Figure 19:
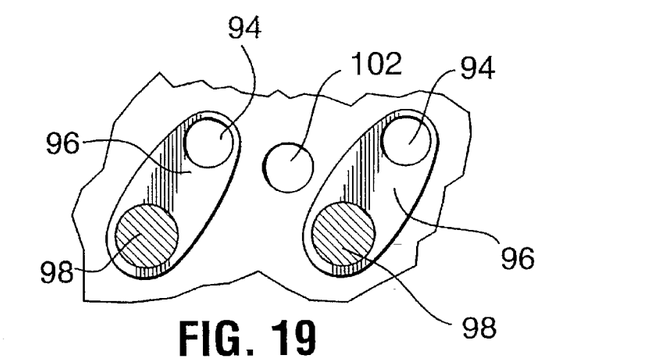
FIG. 19 is a view similar to FIG. 18 of a modification to the fifth embodiment.

In a modification as shown by FIG. 19, additional apertures 102 pass through the printed circuit board between the footprints 96 and these apertures 102 are themselves filled with the thermally conductive material 38 which may also extend through and fill a space between each of the electronic components 92 and the printed circuit board.

Figure 20:
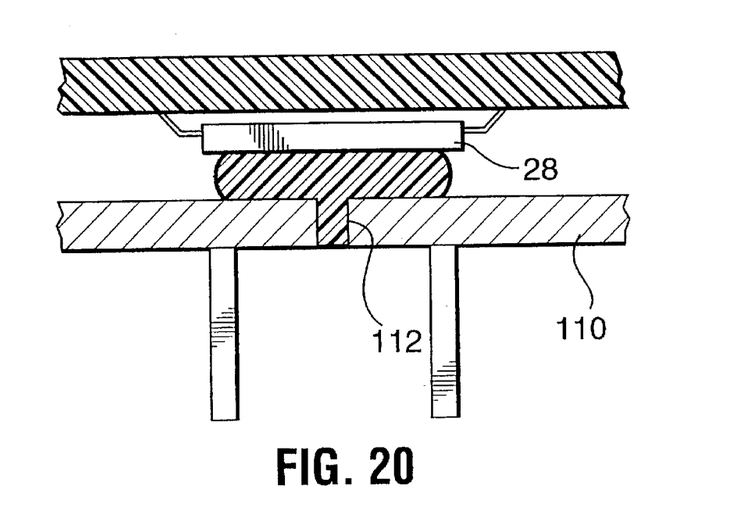
FIG. 20 is a cross-sectional view through a sixth embodiment.

A sixth embodiment as shown by FIG. 20 shows that heat exchange elements mounted upon a heat sink whether shows in this order or in reverse, thus making the thermal connection to the printed circuit board instead, are not essential to the invention, although such elements may be preferred for ease of disassembling the finished assemblies.

In the sixth embodiment which provides all of the maximized heat conducting properties of the previous embodiments, a heat sink structure comprises a heat sink 110 which is formed with holes 112 for alignment with the electronic component 28 mounted upon a printed circuit board 26. Thermal conductive material 38 is injected through the holes 112 to occupy spatial regions between each component 28 and the opposing heat sink surface so as to transfer heat directly from the component to the heat sink.

What is claimed is:

1. A method of making a printed circuit board and heat sink structure assembly comprising:
   providing a structure comprising a printed circuit board and an electronic component mounted upon a first side of the printed circuit board;

providing a heat sink structure with a hole defined through the heat sink structure;

relatively disposing the printed circuit board structure and the heat sink structure with a first side of the heat sink structure facing and spaced from the printed circuit board structure and with the hole having its axis extending in the direction generally towards the electronic component and creating a heat conductive path from the heat sink structure to the printed board structure by causing a flowable settable thermally conductive material to flow through the hole to occupy and remain in a spatial region between and in heat conductive contact with the heat sink structure and the printed circuit board structure and in alignment with the electronic component.

2. A method according to claim 1 comprising:

relatively disposing the printed circuit board structure and the heat sink structure with the first side of the heat sink structure facing the first side of the printed circuit board;

and causing the settable thermally conductive material to flow through the hole to fill the space between the heat sink structure and the electronic component and to heat conductively contact the electronic component.

3. A method according to claim 1 comprising:

relatively disposing the printed circuit board structure and the heat sink structure with the first side of the heat sink structure facing and spaced from a second side of the printed circuit board;

and causing the thermally conductive material to flow through the hole to fill the spatial region between the heat sink structure and the printed circuit board structure and to flow from the spatial region through at least one aperture in the printed circuit board and towards the electronic component.

4. A method according to claim 3 comprising causing the thermally conductive material to flow through the aperture in the printed circuit board and into heat conductive contact with the electronic component.

5. A method according to claim 1 comprising:

relatively disposing the printed circuit board structure and the heat sink structure with the first side of the heat sink structure facing and spaced from a second side of the printed circuit board;

causing a first mass of the thermally conductive material to flow between the first side of the printed circuit board and the electronic component and into heat conductive contact with the electronic component;

and causing a second mass of the thermally conductive material to flow through the hole and between the second side of a printed circuit board and the heat sink structure and into heat conductive contact with the heat sink structure and into heat conductive contact with the first mass.

6. A method according to claim 5 comprising inserting an injection means through the hole in the heat sink structure and into an aperture in the printed circuit board and injecting the first mass of the thermally conductive material between the first side of the printed circuit board and the electronic component;

and subsequently causing the second mass to flow through the hole to occupy the spatial region between the heat sink structure and the second side of the printed circuit board.

7. A method according to claim 1 comprising:

with the printed circuit board structure separate from the heat sink structure, causing a first mass of the thermally conductive material to flow between the first side of the printed circuit board and the electronic component and into heat conductive contact with the electronic component;

and then assembling the printed circuit board and heat sink structures together and subsequently causing a second mass of the thermally conductive material to flow through the hole and between the second side of the printed circuit board and the heat sink structure and into heat conductive contact with the heat sink structure and into heat conductive contact with the first mass.

8. A method according to claim 1 comprising:

providing a plurality of electronic components mounted upon the first side of the printed circuit board;

providing the heat sink structure with a plurality of holes therethrough;

relatively disposing the circuit board structure and the heat sink structure with the holes generally axially directed towards an associated electronic component;

and causing the thermally conductive material to flow through the holes in the heat sink structure to occupy spatial regions between the heat sink structure and the printed circuit board structure and in alignment with the electronic components.

9. A method according to claim 1 wherein the heat sink structure comprises a heat sink and heat sink exchange element thermally conductively mounted upon the heat sink, the heat exchange element spaced from and opposing the printed circuit board structure and facing in a direction towards the electronic component, the method comprising causing the settable thermally conductive material to flow into a spatial region between the printed circuit board structure and the heat exchange element and into heat conductive contact with the heat exchange element, the thermally conductive material having an adhesive property which provides adherence between the printed circuit board structure and the heat exchange element, heat sink release means being provided to enable the heat sink to be removed from the heat exchange element which is adhered to the printed circuit board structure by the thermally conductive material.

10. A method according to claim 7 wherein side walls are provided upon the heat sink structure, the method comprising abutting edge regions of the printed circuit board against engagement surfaces of the side walls to determine the position of the circuit board structure relative to the heat sink structure and determine the distance between the two structures before the thermally conductive material is caused to flow through the holes.

11. A printed circuit board and heat sink structure assembly comprising:

a structure of a printed circuit board and an electronic component mounted upon a first side of the printed circuit board;

a heat sink structure with a hole defined through the heat sink structure;

the two structures disposed face-to-face and spaced apart with the hole extending in a direction generally towards the electronic component;

and thermally conductive material that has flowed through the hole to be disposed between the two structures and occupy a spatial region extending across the hole and in heat conductive contact with both structures and in alignment with the electronic component.

12. An assembly according to claim 11 wherein the heat sink structure faces the first side of the printed circuit board and the thermally conductive material is disposed between and in heat conductive contact with the electronic component and with the heat sink structure.

13. An assembly according to claim 11 wherein the heat sink structure faces a second side of the printed circuit board and the thermally conductive material extends through an aperture in the printed circuit board into heat conductive contact with the electronic component.

14. An assembly according to claim 11 wherein the heat sink structure faces the second side of the printed circuit board and the thermally conductive material extends between and is in thermal conductive contact with the second side of the printed circuit board and with the heat sink structure and extends between and is in thermal conductive contact with the electronic component and the first side of the printed circuit board, the heat exchange material on one side of the board being in thermal conductive relationship to the heat exchange material on the other side of the board.

15. An assembly according to claim 14 wherein the heat conductive material extends through at least one aperture in the printed circuit board to interconnect the thermal conductive material on both sides of the board.

16. An assembly according to claim 14 wherein another heat conductive material is located within at least one aperture in the printed circuit board and is in thermal conductive contact with the thermally conductive material on each side of the board.

17. An assembly according to claim 11 wherein the heat sink structure faces the second side of the printed circuit board and the electronic component has terminals attached to terminals of the printed circuit board by a solder ball grid array, and thermally conductive material extends between and is in thermal conductive contact with the heat sink structure and with the second side of the printed circuit board and the thermally conductive material extends into apertures in the printed circuit board and is in heat conductive relationship with the solder ball grid array.

18. An assembly according to claim 11 wherein the heat sink structure comprises a heat sink and heat exchange element extending through the heat sink and facing towards the electronic component and the thermally conductive material has an adhesive property and is disposed between and in heat conductive contact with the printed circuit board structure and the heat exchange element, and the heat exchange element is formed with the hole through which the thermally conductive material has flowed, the heat exchange element being adhered to the printed circuit board structure by the thermally conductive material and mounted upon the heat sink so as to enable the heat sink to be removed from the heat exchange element while the heat exchange element remains carried upon the printed circuit board structure by the thermally conductive material.

19. An assembly according to claim 18 wherein the heat exchange element comprises a wide portion and a narrow portion, the hole extending through the wide and narrow portions, the heat exchange element mounted upon the heat sink with the narrow portion extending through the heat sink and the wide portion on the side of the heat sink facing the printed circuit board structure, the thermally conductive material disposed between the wide portion and the printed circuit board structure.

20. An assembly according to claim 19 wherein a screw-threaded arrangement is provided to mount the heat exchange element to the heat sink and to render the heat sink detachable from the structure.

21. An assembly according to claim 20 wherein the narrow portion of the heat exchange element has an end region remote from the wide portion, and the screw-threaded arrangement comprises a screw-thread on the end region and a nut engageable on the end region on a second side of the heat sink.

22. An assembly according to claim 21 wherein the heat exchange element has a frangible region upon the narrow portion and the heat exchange element is rotatable within the aperture of the heat sink to cause fracture of the heat exchange element with the narrow portion remaining in the aperture and so as to enable detachment of the heat sink.

23. An assembly according to claim 18 wherein the thermally conductive material is frangible and the heat exchange element is rotatable within the aperture of the heat sink to cause fracture of the adhesive between the structure and the wide portion of the heat exchange element so as to allow for detachment of the heat sink together with the heat exchange element from the structure.

24. An assembly according to claim 19 wherein side walls are provided upon the heat sink and the side walls have engagement surfaces for abutting end regions of the printed circuit board when the heat sink is in the position mounted upon the narrow portions.

25. An assembly according to claim 10 wherein the heat sink forms one part of a housing for completely enclosing the printed circuit board structure.

* * * * *